United States Patent [19]

Anthony

[11] Patent Number: 4,585,493

[45] Date of Patent: Apr. 29, 1986

[54] GRAIN-DRIVEN ZONE-MELTING OF SILICON FILMS ON INSULATING SUBSTRATES

[75] Inventor: Thomas R. Anthony, Schenectady, N.Y.

[73] Assignee: General Electric Company, Schenectady, N.Y.

[21] Appl. No.: 615,403

[22] Filed: Jun. 26, 1984

[51] Int. Cl.[4] .................... H01L 21/36; H01L 21/40
[52] U.S. Cl. .................... 148/171; 148/172; 148/177; 156/613; 156/624; 75/65 ZM
[58] Field of Search ............ 148/171, 172, 1.5, 177; 75/65 ZM; 156/613, 624

[56] References Cited

U.S. PATENT DOCUMENTS

| | | | |
|---|---|---|---|
| 3,897,277 | 7/1975 | Blumenfeld | 148/1.5 |
| 4,160,679 | 7/1979 | Houston et al. | 148/171 X |
| 4,170,491 | 10/1979 | Cline et al. | 148/1.5 |
| 4,178,192 | 12/1979 | Anthony et al. | 148/1.5 |
| 4,198,247 | 4/1980 | Anthony et al. | 148/1.5 |
| 4,323,417 | 4/1982 | Lam | 156/613 |
| 4,371,421 | 2/1983 | Fan et al. | 148/171 X |
| 4,473,433 | 9/1984 | Bosch et al. | 148/1.5 X |

OTHER PUBLICATIONS

Grain-Driven Zone Melting, T. R. Anthony, Report No. 84CRD008, Jan. 1984.

Primary Examiner—George T. Ozaki
Attorney, Agent, or Firm—Paul E. Rochford; James C. Davis, Jr.; James Magee, Jr.

[57] ABSTRACT

A method of growing single crystal layers from polycrystal layers is taught. The method involves forming a eutectic of the polycrystal material and an alloying metal and forming a eutectic bridge between a seed single crystal and the polycrystalline material with the eutectic alloy. The alloy is kept molten and both the single crystal and polycrystal are kept solid at a temperature to induce the eutectic alloy to eat into the polycrystal and to extend the single crystal to form a single crystal layer.

23 Claims, 7 Drawing Figures

GRAIN-DRIVEN ZONE-MELTING OF SILICON FILMS ON INSULATING SUBSTRATES

BACKGROUND OF THE INVENTION

The present invention relates to methods and means by which thin single-crystal silicon films may be formed on insulating substrates. More particularly, it relates to a method by which thin single-crystal silicon films may be formed on insulating substrates from polycrystalline deposits of silicon on the substrates.

There is a need, at the present time, for silicon films of single crystal variety on insulating substrates for use in the manufacture of very large scale integrated circuits (VLSI). These circuits provide the advantage of achieving high packing densities and speeds in the circuitry.

Currently, a large amount of effort has been concentrated on recrystallizing thin films of polycrystalline silicon by moving concentrated heat sources across a wafer to melt the polycrystalline material as the heated zone advances and to permit recrystallization of silicon at the trailing edge of the molten zone. The several processes by which the heat is generated and applied characterizes the several recrystallization process. Heat sources such as graphite, heaters, strip heaters, lasers, electron beams, quartz halogen lamps, and RF susceptors have all been used as heat sources.

Such efforts are described in a number of publications as follows:
1. M. W. Geis, H. I. Smith, B. Y. Tsaur, J. C. Fan, D. J. Silversmith and R. W. Mountain, *J. Electrochem. Soc.* 129, 2817 (1982).
2. J. F. Gibbons, *Laser and Electron Beam Solid Interactions and Material Processing*, ed. J. F. Gibbons, L. D. Hess and T. W. Sigmon (North Holland, N.Y., 1981) p.449.
3. T. I. Kammis and A. C. Greenwalt, *Appl. Phys. Lett.* 35, 282 (1979).
4. T. J. Stultz and J. F. Gibbons, *Appl. Phys. Lett.* 41, 824 (1982).
5. Y. Kobayashi, A. Fukami and T. Suzuki, *IEEE Electron. Deve. Lett. EDL*-4, 132 (1983).

A survey of efforts in these techniques is presented in an RCA Review, Vol. 44 at page 250 written in 1983 by L. Jastrzebski.

Many of the prior art silicon-on-insulator structures have utilized a silicon wafer as a crystalline substrate, overlaid with a layer of silicon dioxide as the insulating substrate. Such substrates have the problem that at temperatures above 1000° C. silicon is mechanically weak and has a yield stress less than that of annealed copper. As a consequence, it is not feasible to pass a hot thermal zone over a silicon wafer without causing plastic yielding and wafer warpage except under those special conditions where the temperature difference from one part of the wafer to another never exceeds 10° C. and therefore where the temperature of the entire wafer must be raised to within 10 degrees of the melting point (1410° C.) of silicon.

Although impressive results have been attained with the thermal zone-melting method, an improved process of recrystallizing thin films of silicon on an insulating base is desirable. For such a process, it is recognized that it would be desirable to use conventional semiconducting processing equipment such as is widely and inexpensively available. Also, it would be desirable that such a process be carried out under isothermal conditions at temperatures far below the melting point of silicon when the wafer is a silicon oxide insulating coating on a single crystal silicon base. Such lower temperature production is feasible by the method of the present invention based on use of eutectic compositions which melt at temperatures substantially below the melting point of silicon.

Also desirably such a process should be a batch oriented process capable of producing 400–500 wafers per run and should result in a low impurity level in the recrystallized silicon. The process of the present invention has this capability.

It has now been discovered that it is possible to produce silicon on insulated wafers which meet all of these criteria and to do so at an economical cost. The method of the present invention is distinct from the zone melting process referred to above in that it does not employ a heat source to impart heat or a temperature gradient to the polycrystalline silicon layer. Nevertheless, it does result in the generation of a zone melt which advances across the polycrystalline layer to melt the polycrystalline silicon as it advances and to leave a single crystal of silicon at the trailing edge of the molten zone. The process is carried out at temperatures far below the melting point of silicon.

Uniquely, the present method harnesses the free energy difference between polycrystalline and single crystal silicon to generate and to drive the molten eutectic zone. For this reason it is referred to herein as a grain-driven zone melting.

BRIEF DESCRIPTION OF THE INVENTION

It is, accordingly, one object of the present invention to provide a method for forming single crystal silicon wafers.

Another object is to provide a method for formation of seeded single-crystal silicon films on an insulating substrate.

Another object is to provide a method for forming single-crystal silicon films which does not require zone heating.

Another object is to provide a method for forming single-crystal silicon films without causing plastic yielding of the substrate of the insulator and without causing wafer warpage.

Another object is to provide a method of producing single-crystal silicon films at temperatures far below the melting point of silicon.

Other objects and advantages of the present invention will be in part apparent and in part pointed out in the description which follows.

In one of its broader aspects, objects of the present invention can be achieved by providing a single-crystal wafer as a substrate and forming an oxide layer on the surface of the single-crystal wafer. A slit window opening is then formed in the oxide layer along a line oriented to induce a certain directional growth in single-crystal structure to be grown over the oxide layer. A polycrystalline layer is then deposited over the silicon oxide insulator on the single crystal silicon substrate. A strip of alloying metal is deposited over the surface of the polycrystalline deposit to conform in shape to the slit window opening formed in the silicon oxide layer. The structure is then heated to a temperature which forms a eutectic between the deposited strip of metal and the silicon and affords a single-crystal seeding contact between the liquid alloy zone and the underlying single-crystal substrate. At a uniform and constant temperature, the eutectic liquid metal zone moves across the top surface of the silicon oxide to dissolve the polycrystalline silicon metal in its path and to leave a solid single-crystal silicon layer in its wake. In this manner, a single-crystal silicon layer is formed on the silicon oxide layer disposed over single-crystal silicon substrate of the wafer.

BRIEF DESCRIPTION OF THE DRAWINGS

In the description which follows the subject matter will be made clear as by reference to the accompanying drawings in which.

DETAILED DESCRIPTION OF THE INVENTION

The base on which the structure of this invention is formed is a single crystal silicon wafer well known in the art.

The first step in preparing a sample pursuant to this invention is to obtain or provide a prior art single-crystal silicon base having the preferred crystal orientation. As is well known in this art such a base has a preferred crystal orientation which is either the <100> orientation or the <111> orientation. Such silicon single-crystal wafers are available commercially and have surfaces which have been finished for further operations after having been sliced and polished from a larger single-crystal cast bilet.

The commercially available single-crystal wafer is heated in an oxidizing oven for a time sufficient for the formation on the preferred orientation surface of a silicon oxide layer of a thickness of from 0.5 to 1.5 microns. The furnace used in preparing the sample should have an oxygen or steam atmosphere and not an air atmosphere.

Following the formation of the silicon oxide layer on the silicon wafer, the oxide is selectively etched from a slit window area selected as a seeding area. By seeding is meant that the subsequent initiation of growth of a single-crystal layer of silicon deposited over silicon oxide insulating layer will occur from the zone in which the oxide has been removed.

The etching removal of the silicon oxide layer from the slit window seeding zone is done with conventional photolithography or by conventional photolithography techniques well-known in the art. The operative agent for the etching of the silicon oxide is the conventional buffered hydrofluoric acid after the necessary preliminary steps have been taken using the photolithography technique. The slit window opening made in this fashion is conveniently about 5 microns wide and extends between opposing edges of the wafer.

The completion of the photolithography process involves removal of all of the materials which had been used in the photolithography to return the wafer to the condition in which single crystal substrate has a silicon oxide insulating layer in all areas except the seeding slit window.

The polycrystalline silicon layer is then deposited over the entire surface of the wafer including both the silicon oxide zone and the seeding slit zone where the surface of the single-crystal silicon is exposed.

Following deposit of the polycrystalline upper layer, a stripe of eutectic-forming metal is deposited in alignment with the seeding slit window. The thickness of the eutectic-forming layer must be sufficient to permit the eutectic which is formed on heating of the wafer to penetrate entirely through the polycrystalline overlayer and to bring eutectic through the slit window and into contact with the upper surface of the single-crystal substrate.

An alternative method for deposit of the eutectic to initiate the conversion of the polycrystalline layer to a single-crystal layer can be accomplished by removal of both the polycrystalline layer after it is deposited and of the silicon oxide to form the designated slit window opening. The slit window must penetrate through to the single-crystal substrate. This alternative procedure eliminates the need for the removal of the silicon oxide to open the slit window prior to the deposition of the polycrystalline silicon layer. This is a preferred method for formation of products of the present invention. In this alternative procedure, the eutectic-forming metal is deposited directly onto the single-crystal substrate and is made to overlap the polycrystalline upper layer to permit the alloying and eutectic-forming phenomena to occur and to permit the subsequent conversion of the polycrystalline silicon layer to a single crystal silicon layer. This permits the single-crystal upper layer to form from the single-crystal formation of the substrate.

Figure 1:
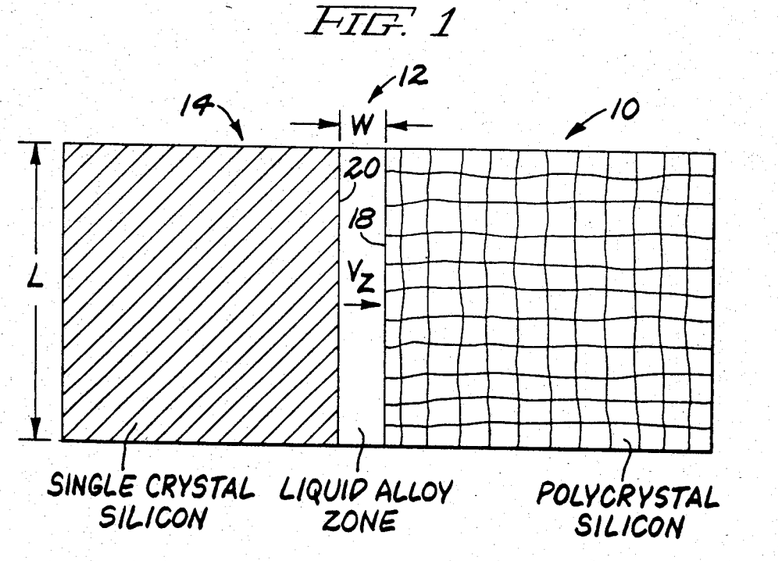
FIG. 1 is a semischematic plan view of a silicon film showing single-crystal silicon on the left, liquid alloy zone in the middle and a polycrystalline silicon on the right.

Referring now first to FIG. 1, there is illustrated in semischematic fashion a plan view of a polycrystalline silicon wafer 10 being converted by a migrating liquid alloy zone 12 into a single crystal silicon wafer 14. The wafer is illustrated in semischematic elevational view in FIG. 2 to be disposed as a thin layer on a substrate 16. Pursuant to the present invention, the substrate may be a layer of silicon oxide although other relatively inert substrates such as other metal oxides may be employed. From FIGS. 1 and 2, the zone 12 may be seen to have a height (H), a width (W) and a length (L) between the polycrystalline layer 12 and the single crystal silicon layer 14. In general, the silicon in the polycrystalline film has a higher free-energy on average than silicon in the single-crystal film. Because of this free-energy difference, the liquid solubility of silicon at the interface 18 of the alloy liquid and polycrystalline silicon, is higher than is the liquid solubility of silicon at the interface 20 between the liquid and single-crystal. This solubility difference results in a concentration gradient of silicon across the liquid zone and the present invention takes advantage of the concentration gradient created by practice of the invention.

Figure 2:
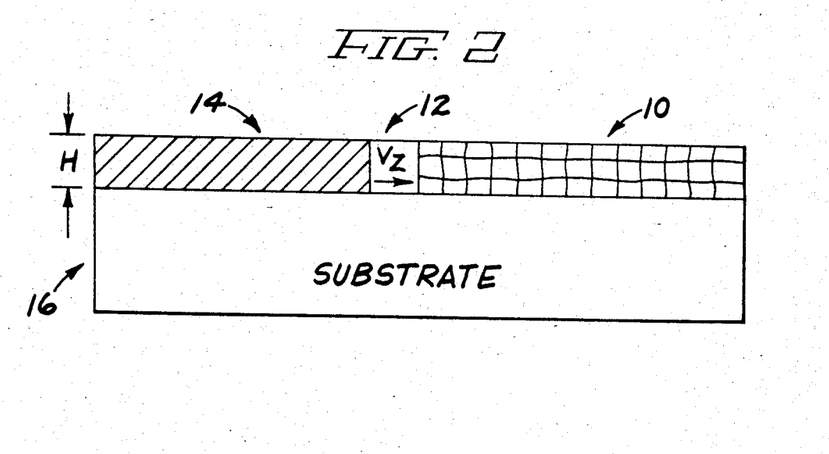
FIG. 2 is an elevational view of the silicon film of FIG. 1 illustrated as disposed on an insulating substrate.

Such a concentration gradient generates a flux of silicon across the liquid zone. This flux of silicon across the zone is maintained by the continual dissolution of silicon from the polycrystalline face and the continual deposition of silicon on the single-crystal face of the liquid zone. I have observed that if the conditions are maintained in the proper fashion as discussed below, the liquid zone eats into the polycrystalline material on a continuous basis and continuously leaves a regrown single-crystal silicon at its trailing edge and in its path.

I have found that it is feasible to produce single-crystal silicon wafers on a silicon oxide surface by recrystallization from the polycrystalline to the single-crystal form. Also I have found that this may be accomplished within a reasonable time frame due to the velocity of the migration of the melt zone.

The migration velocity $V_Z$ of a liquid zone is given by the following equation:

$$V_Z = \frac{\tilde{D}}{RT} \frac{X_{Si}^L}{1 - X_{Si}^L} \frac{3 \gamma_{GB} \bar{V}_{Si}^S}{aW} \quad (1)$$

where:
D is the interdiffusion coefficient of the liquid
R is the universal gas constant
T is the absolute temperature
$X^L_{Si}$ is the atomic fraction of silicon in the liquid alloy zone
$\gamma_{GB}$ is the grain boundary energy of silicon
$\bar{V}^S_{Si}$ is the partial molar volume of silicon in solid silicon
a is the polycrystalline grain diameter, and
W is the width of the liquid zone.

The above equation can also be written in the alternative form as follows:

$$V_Z = \frac{\tilde{D}}{RT} \frac{X_{Si}^L}{1 - X_{Si}^L} \frac{\bar{V}_{Si}^S}{W} \left( \frac{\partial \Delta G}{\partial \bar{V}_{Si}^S} \right) \quad (2)$$

Equation 2 is valid in cases where only the free energy difference $\Delta G$ between the deposited and recrystallized silicon is known. An example of this situation is a deposition of amorphous silicon where the grain-boundary energy is not a useful concept although the process does function and the single crystal silicon wafer is obtained.

It will be understood that the term "zone melting" as used in this application refers to the process which includes adding a eutectic-forming alloying agent to the melt zone of the silicon so that the melt zone is a liquid at temperatures below the temperatures at which the silicon itself is a liquid. In other words, it is to be understood with reference to zone melting that a host material which is being recrystallized is to be made to contain another element in addition to the host material (as in this case silicon) to effectively reduce the melting point of the host in the melt zone. This is done to make it possible to retain the single crystal material in the solid state and the polycrystalline silicon in the solid state but at the same time to have a molten zone which is advancing from single crystal material to and through the polycrystalline material because of the lower melting point of the material in the melt zone. The effect of this added eutectic-forming material is to lower the melting point of the host silicon material in the wafer in the region of the zone.

Figure 3:
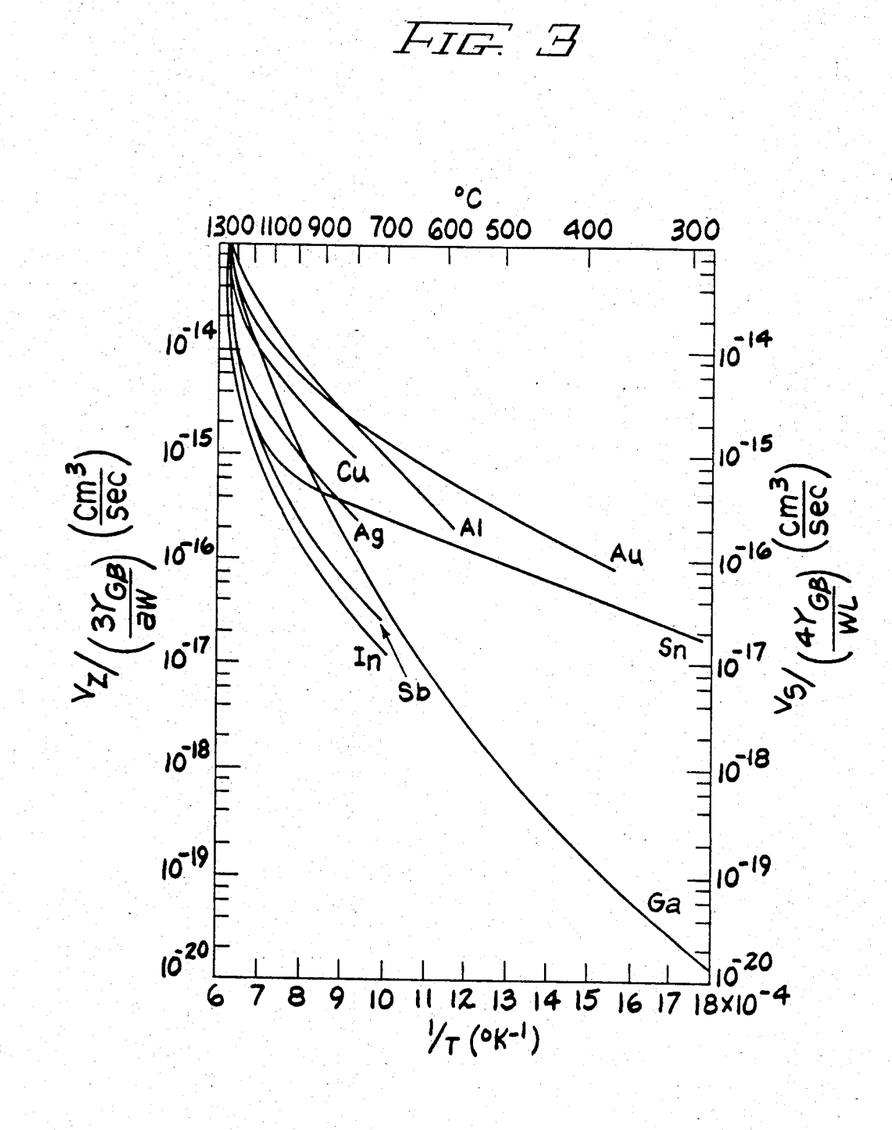
FIG. 3 is a series of graphs of the migration velocity, $V_Z$, (divided by a normalizing factor) plotted against temperature for a variety of binary alloy melt zones migrating in silicon. Zone migration is shown to be feasible at temperatures ranging from about 300° C. to about 1400° C.

With this background and referring now specifically to FIG. 3, the figure is a graph of the normalized melt-zone velocity versus temperature for a variety of binary-alloy melt zones migrating through a silicon layer. In other words, these zones may be made to contain gold, aluminum, copper, silver, indium, antimony, gallium, tin or alloys thereof. The relationship of the melt-zone velocity $V_Z$ to the temperature in degrees Celsius is shown at the top of the graph, and to the inverse of temperature in degrees Kelvin is shown at the bottom of the graph. From FIG. 3 it is evident that the zone migration is possible employing a temperature in the range extending from 300°–1400° C.

Of the materials included on the graph of FIG. 3, four of these binary alloys do not impart any conductivity type to silicon. The four elements of these binary alloys are copper, silver, gold and tin.

Copper, silver and gold lower the lifetime of minority carriers in silicon and have very high solid-state diffusion coefficients.

One of the binary alloys, namely antimony-silicon, imparts an N-type conductivity to the recrystallized silicon.

Three of the binary alloys, namely, aluminum-silicon, indium-silicon and gallium-silicon, impart a P-type conductivity to the recrystallized silicon.

It is recommended as advisable at higher temperatures to avoid use use of aluminum-silicon migration zones to make silicon-on-insulator films because of the potential problem presented by the ability of aluminum to reduce silicon dioxide and the tendency of the aluminum-silicon-oxide system to form mullite. If a uniform layer of mullite is formed, there is not likely to be a problem in forming the single crystal silicon wafer because the mullite is a good electrical insulator and has a thermal expansion coefficient closely matching that of silicon. A problem exists, however, if the mullite forms irregularly in as much as the planarity and isolation of the silicon wafer film may be detrimentally effected.

Figure 4:
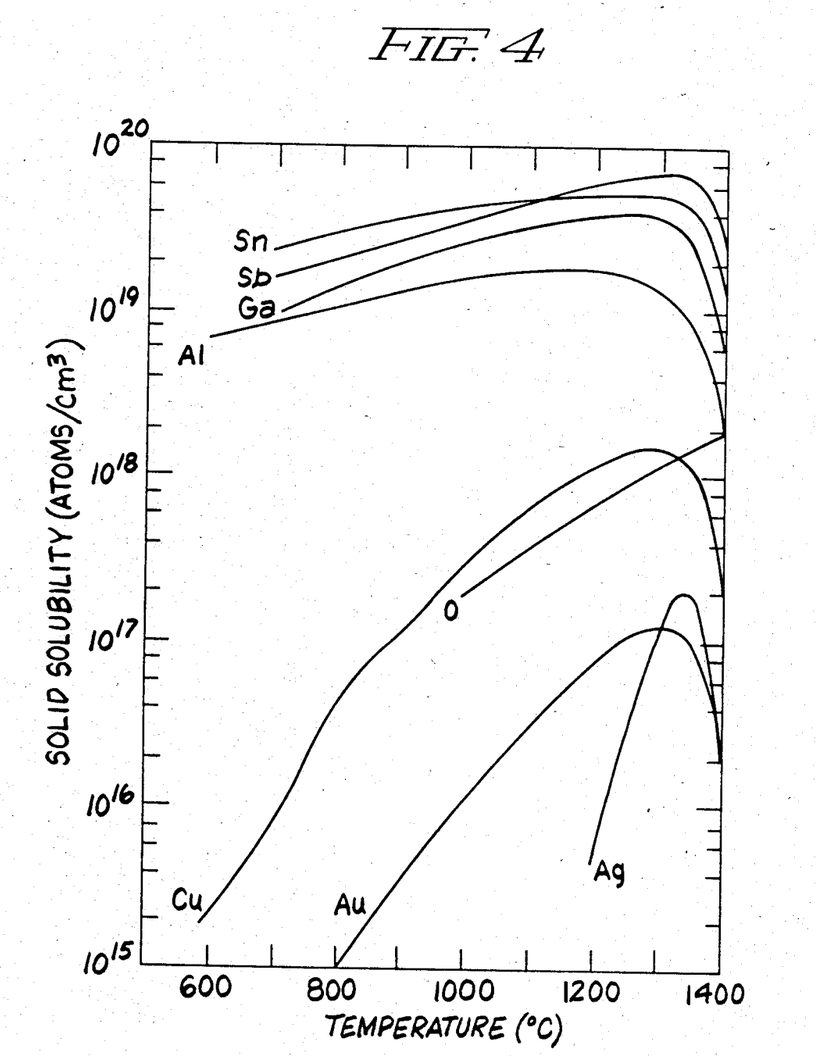
FIG. 4 is a graph illustrating the solid solubility in atoms/cm$^3$ of a number of materials plotted against temperature as the abscissa.

I have also found that because of the solid solubility of various elements in silicon, in order to obtain a very pure single-crystal silicon film, it is important to factor in the solid solubility of the various elements in silicon as illustrated in FIG. 4. For example, if a single crystal film of silicon with an impurity level of less than $10^{15}$ atoms per cubic centimeter is desired, then either gold or silver should be used to form the melt zone.

Further, the relationship between the concentration of the impurity and the temperature at which the process is carried out must be considered. For example, with reference to forming the silicon film with less than $10^{15}$ atoms per cubic centimeter of impurity, if gold is used it must be used at a temperature below 800° C. to achieve this level of purity as is evident from FIG. 4.

Also, if silver is used, the silver must be used below 1150° C. to achieve the desired purity level.

Even such high purity films will contain some oxygen inasmuch as the melt zone, if moved according to the process of this invention, is in contact with a silicon dioxide insulating layer as the melt zone migrates across the wafer. However, the level of oxygen present will be one to two orders of magnitude below the level present when the film is formed by thermal zone melting as described in the background statement above. In such cases, that is in the prior art zone melting, the liquid zone is above the melting point of the silicon whereas in the subject method the temperature of the liquid melt zone is significantly below the melting point of the silicon.

The solid solubility of the other elements shown in FIGS. 3 and 4 are too high at temperatures where the zone migration rate is still within a practical range for the formation of high purity silicon films.

The rate of migration of the zone varies with the crystal size of the polycrystalline layer.

Figure 5:
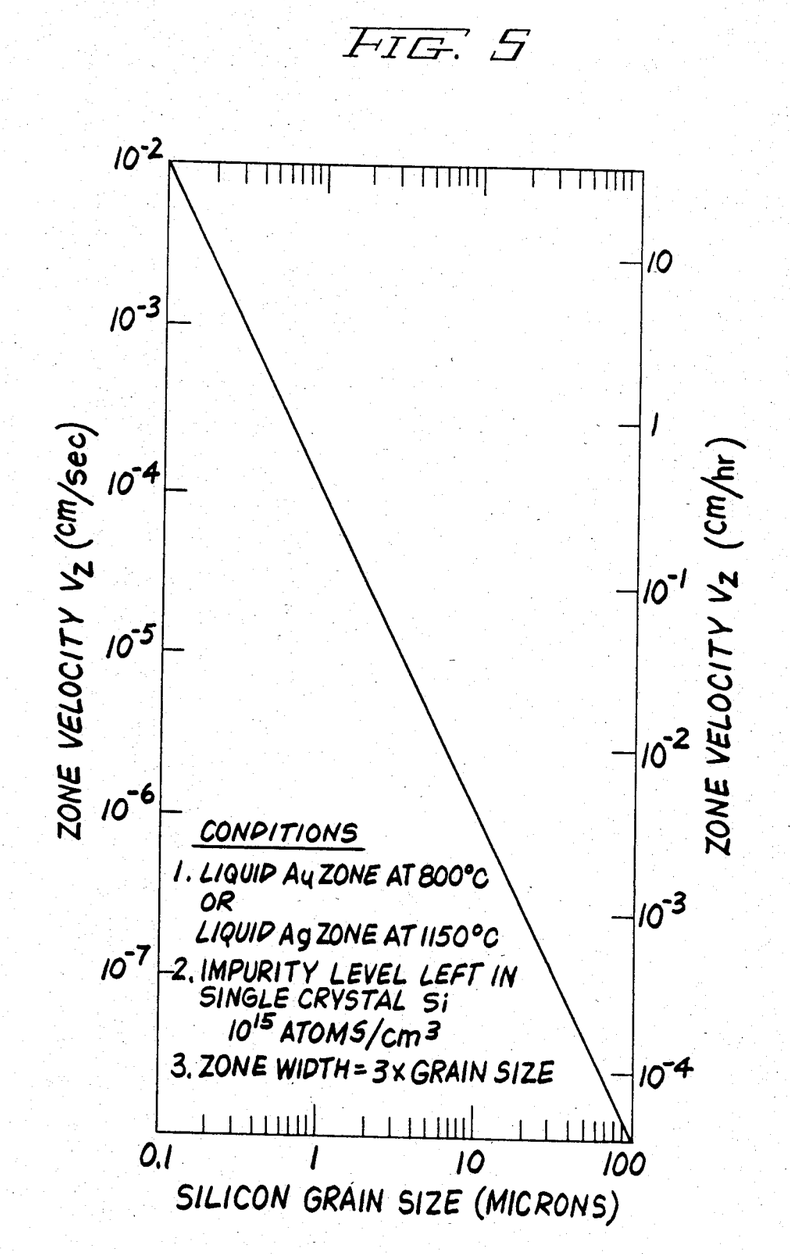
FIG. 5 is another graph, this one illustrating the zone velocity $V_Z$ in centimeters per second and per hour plotted against the silicon grain size in microns.

FIG. 5 may be referred to to determine zone migration velocity from the relationship of the zone velocity to the silicon grain size in microns. On the left hand scale, the zone velocity $V_Z$ is given in centimeters per second and on the right hand scale the zone velocity $V_Z$ is given in centimeters per hour. The silicon grain size in microns extends all the way from 1/10 micron up to 100 microns on the abscissa scale.

Accordingly, FIG. 5 shows the relationship between the velocity of migration of the melt zone and the grain size of the polycrystalline silicon. It may be used to determine the time needed to form a high purity single-crystal silicon film based on the grain size of the polycrystalline silicon film from which it is to be grown. As is evident from the figure, for a grain size of the polycrystalline silicon film of about 1 micron, the time required to process a 4 inch diameter silicon-on-insulator wafer into a single zone is approximately 10 hours. One advantage made possible by the present invention is that because the grain-driven zone melting is an isothermal process, about 450 wafers can be simultaneously annealed together in a conventional diffusion furnace in a single heating. Such a 10 hour 450 wafer run gives an output of about 45 wafers per hour per furnace. The processing required to achieve such production can be run with either a gold zone at about 800° C. or with a silver zone at about 1150° C.

Pursuant to the method of the present invention, it is possible also to form multiple zones on a single wafer and by doing so, the time for the production of a wafer is reduced by a proportionate amount. In other words, if 4 parallel slit windows are opened and parallel zones extending between opposite edges of the wafer are formed on a single wafer 4 inches in diameter, the time to produce the single-crystal layer is approximately ¼ of that needed for a single zone wafer. Also, the use of 10 zones on a 4 inch wafer allows processing to be completed in 1 hour and results in a wafer output of about 450 wafers per hour per furnace. The offsetting disadvantage of using multiple zones is the multiple lines on the wafer at the locations where single-crystal seeding slit windows were started for each zone.

Figure 6:
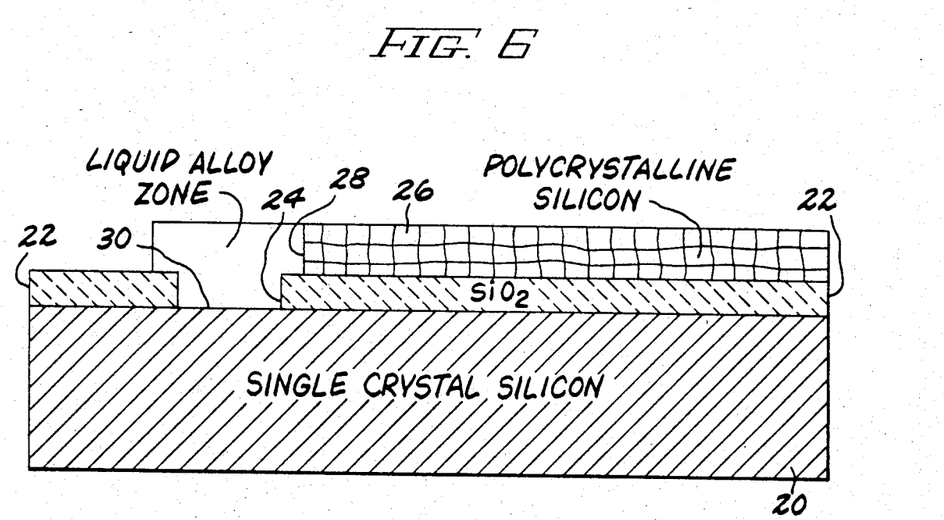
FIG. 6 is a semischematic elevational view of the relationship between a single-crystal silicon base, a silicon dioxide insulating layer and a polycrystalline silicon overlaid layer and a window opening in the insulating layer.

The method by which a single-crystal seeding is started as illustrated for a single zone is schematically illustrated in FIG. 6. If the seeding lines or seeding window slits are made to coincide with chip scribing lines along which the wafer is cut into chips after chip circuit formation is completed, the principal disadvantage of multiple-zone professing is eliminated.

Referring again to FIG. 6, a silicon oxide layer 22 is grown on a single-crystal silicon base 20. A slit window opening 24 in layer 22 permits access of a liquid alloy formed at the edge of a polycrystalline silicon layer 26.

A fused zone 23 extends both through the polycrystalline silicon layer 26 and also through the opening 24 in the insulating silicon oxide layer 22. It accordingly makes contact with the upper surface of the single crystal silicon wafer 20. The liquid alloy 23 eats into the edge 28 of polycrystalline silicon layer 26. There is a deposit left in its wake as it migrates across the surface of $SiO_2$ layer 22 and this deposit is a single-crystal silicon wafer which starts its growth from the surface 30 of the single-crystal silicon wafer 20.

In the practice of the present invention, care must be exercised to avoid destabilizing the migrating liquid zone. The overall stability of the migrating zone is an important consideration in the practice of the grain-driven zone melting process of the present invention. The front face of the zone may become unstable because of several factors. The first factor is the disintegration of the liquid zone itself. I have found that if the liquid comprising zone is able to wet the grain boundaries of the polycrystalline film in front of it, there is a tendency for the liquid zone to disintegrate. I have observed that grain-boundary wetting will occur if the grain-boundary energies of the silicon $\gamma_{GB}$ is greater than twice the solid-liquid interface energy of $\gamma_{SL}$.

My studies of the relative magnitudes of $\gamma_{SL}$ and $\gamma_{GB}$ has demonstrated that the grain-boundary wetting will not generally occur. However, in certain special cases, the breakup of the polycrystalline zone can occur and these conditions are those where the following expression is satisfied:

$$2 \times \gamma_{SL} < \gamma_{GB}.$$

Accordingly, the conditions of this expression should be avoided to minimize or obviate the destabilization of the migrating liquid zone.

Figure 7:
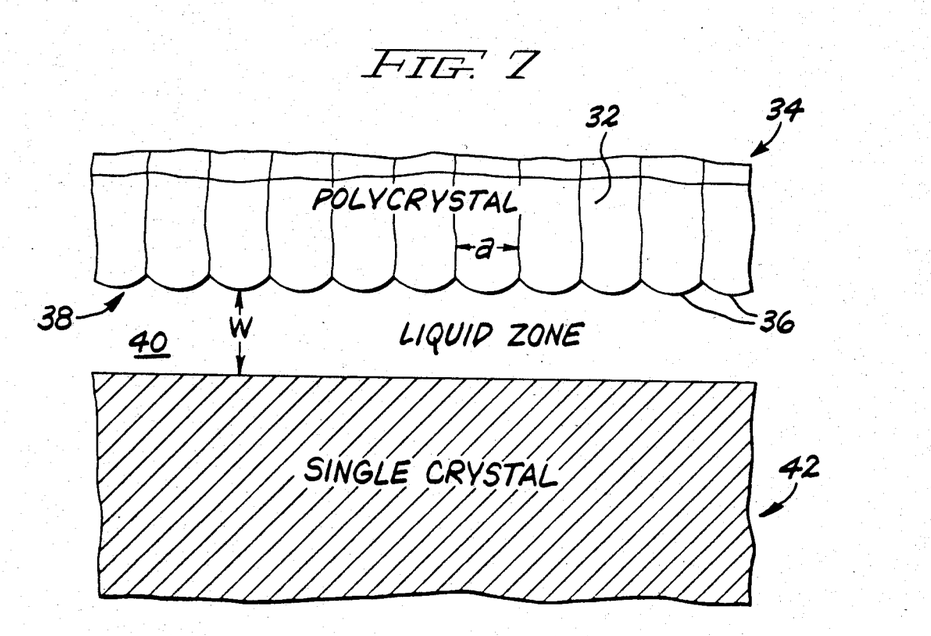
FIG. 7 is a top plan view of a single-crystal segment, a contiguous molten zone and an oppositely contiguous polycrystalline array segment showing the gradual consumption of the polycrystalline material at the leading edge of the zone and the formation of single-crystal wafer at the trailing edge of the zone.

The second cause of instability of the migrating liquid zone concerns the puckering of the front interface of the liquid zone. This occurs in the absence of grain-boundary wetting. The leading interface becomes puckered because of local equilibrium established between solid-liquid and grain-boundary surface tensions at junction points of the liquid zone with grain boundaries. This puckering is illustrated schematically in FIG. 7. In this figure, the individual grain 32 of the polycrystalline layer 34 becomes indented at the grain boundaries 36 as the leading edge 38 of the migrating eutectic melt 40 advances into the polycrystalline silicon. The single crystal layer 42 formed at the trailing edge of the liquid zone continues to form so long as the separation W between the leading and trailing edges is sufficiently large. To avoid the deleterious effects of puckering, i.e. to avoid the possibility of forming solid bridges across the liquid zone, the width W of the liquid zone should preferably be kept about 3 times the grain size a of the polycrystalline film. Accordingly, it is preferred to operate in the mode where:

$$W = 3a.$$

Another stability factor in the practice of the present invention, or in other words, another means by which stability can be maintained or improved concerns the rear or trailing phase of the liquid zone. The stability of the rear phase of the liquid zone is at least in part dependent and contingent on the selection of a zone direction which obtains the result that the rear interface is parallel to a minimum-energy facet plane of single-crystal silicon. The facet plane required to maintain the minimum-energy is a (111) plane.

Vector-dot-product equations such as $<100>\bullet<XYZ>$ are well known in the art.

For a silicon seed wafer as illustrated in FIG. 6 with a surface normal orientation of $<100>$, the vector-dot-product equation that the line orientation $<XYZ>$ of the slit window and liquid zone (this is the vector direction along the major axis of the zone) must satisfy are:

$$<100>\bullet<XYZ>=0$$

and $$<111>\bullet<XYZ>=0 \text{ or } <1\bar{1}1>\bullet<XYZ>=0$$

For a silicon seed wafer, as illustrated in FIG. 6, with a surface normal orientation of $<111>$, the vector-dot-product equations that the line orientation $<XYZ>$ of the liquid zone must satisfy are:

$$<111>\bullet<XYZ>=0$$

and $$<1\bar{1}1>\bullet<XYZ>=0 \text{ or } <11\bar{1}>\bullet<XYZ>=0$$

The table lists the resulting line directions that the major axis of the melt zone must be along, in order that the rear face of the zone is stable and planar, for wafer orientations of $<100>$ and $<111>$.

I have found further that the zones as specified here are morphologically stable for the extent of time required for recrystallization as also set out above.

TABLE
STABLE ZONE DIRECTIONS*

| Wafer Orientation | Zone (Slit) Directions |
|---|---|
| '100' | '011' |
|  | '01$\bar{1}$' |
| '111' | '1$\bar{1}$0' |
|  | '01$\bar{1}$' |

*Directions of the major axis of the liquid zone that insure the stability of the rear interface of the zone for '111' and '100' wafer orientations.

A recent article by Jastrzebski referred to above reviews different silicon-on-insulator technologies and assesses the assets and liabilities of these different technologies. Five categories are used in the assessment:
(1) Capability of implementation with conventional processing;
(2) Time required for processing;
(3) Defect density of silicon films;
(4) Stage of development;
(5) Possibility for three-dimensional circuits.

If the subject method is evaluated based on the categories of the Jastrzebski article, it is evident that the subject method passes in four out of the five categories.

The first category is the capability of implementation with conventional processing and the grain-driven zone melting process satisfies this category as only a conventional diffusion furnace is required to practice this process.

Considering the second category, namely the time required for processing, here again the criteria is satisfied inasmuch as wafer production can be as high as 450 wafers per furnace per hour as pointed out above.

Considering next the category (3), specifically the defect density of the single crystal silicon films, this criteria has not yet been established for the grain-driven zone melting technology. However, since the liquid zone is not being forced to migrate in a non-equilibrium mode by an external driving force, it is expected that the defect density may be lower than defect densities associated with some of the thermal zone melting processes.

Turning next to the fourth category, namely the stage of development, the grain-driven zone melting process is in a very early stage of development and is accordingly not a mature technology ready for immediate implementation.

The last category, namely the possibility for three-dimensional circuits, the criteria of this category is satisfactorily met and the grain-driven zone melting has the potential capability of producing three-dimensional integrated circuits since the time-temperature integral required for the formation of the silicon-on-insulator film is low enough to prevent any significant movement of junctions already in the wafer.

Finally if multiple zones are necessary to speed wafer processing, circuit layout would have to avoid the original seeding lines of the zones. Even for as many as ten zones a wafer these seeding lines would be separated by about one centimeter. Such a separation would allow present-size chips to fit easily between seeding lines.

Accordingly it is evident from the foregoing that the present invention provides a highly effective and efficient method for generating single crystal silicon layers on insulating silicon oxide surfaces supported on a base of single crystal silicon.

What is claimed and sought to be protected by letter patent of the United States is as follows:

1. The method of forming a single crystal silicon layer on a silicon oxide insulator layer which comprises;
    forming a silicon oxide insulator layer on a single crystal silicon wafer disc base and forming a slit window in the silicon oxide insulator layer to expose the upper surface of the single crystal silicon wafer disc;
    forming a polycrystalline silicon layer on the silicon oxide insulator layer;
    seeding the polycrystalline silicon layer from the single crystal silicon wafer disc base by forming a melt zone with a eutectic alloying agent aligned with said slit window;
    heating the single crystal silicon wafer disc and the silicon oxide insulator layer and the polycrystalline silicon layer to an isothermal temperature substantially below the melting point of the silicon but above the melting point of the eutectic;
    maintaining the isothermal temperature at a level to cause the melt zone to advance into the polycrystalline silicon layer,
    and to cause a single crystal silicon layer to form from the polycrystalline silicon layer at the trailing edge of the melt zone; and
    cooling the single crystal silicon wafer disc base and the silicon oxide insulator layer and the single crystal silicon layer after the polycrystalline silicon layer has been converted to a single crystal silicon layer.

2. The method of claim 1 in which the eutectic agent is gold.

3. The method of claim 2 in which the processing temperature is less than about 800° C.

4. The method of claim 1 in which the eutectic agent is silver.

5. The method of claim 4 in which the processing temperature is below 1150° C.

6. The method of claim 1 wherein the zone width is at least three times the grain size of the polycrystalline layer.

7. The method of claim 1 in which the zone orientation for a <100> single crystal substrate is <011> or <01$\bar{1}$>.

8. The method of claim 1 wherein the zone orientation for a <111> substrate is <1$\bar{1}$0> or <01/$\bar{1}$>.

9. The method of claim 1 in which the eutectic metal is antimony and the single crystal formed is N-type.

10. The method of claim 1 in which the eutectic metal is selected from the group consisting of aluminum, indium and gallium and the single crystal layer formed is of the P-type.

11. The method of claim 1 in which the eutectic metal is tin.

12. The method of forming a single crystal layer on an insulating substrate which comprises
- disposing a polycrystalline silicon layer on said insulating substrate,
- disposing an alloying metal on a portion of said polycrystalline layer and heating said polycrystalline layer and alloying metal to form a eutectic metal zone in contact with said polycrystalline layer,
- disposing a single crystal silicon seed at one surface of said melt to permit growth of said single crystal from material of said melt, and
- maintaining the wafer heated to cause the melt to advance into the polycrystalline layer and the deposit of single crystal to follow the melt advance.

13. The method of claim 12 in which the eutectic agent is gold.

14. The method of claim 13 in which the processing temperature is less than about 800° C.

15. The method of claim 12 in which the eutectic agent is silver.

16. The method of claim 15 in which the processing temperature is below 1150° C.

17. The method of claim 12 wherein the zone width is at least three times the grain size of the polycrystalline layer.

18. The method of claim 12 wherein the zone orientation for a <100> single crystal substrate is <011> or <01$\bar{1}$>.

19. The method of claim 12 wherein the zone orientation for a <111> substrate is <1$\bar{1}$0> or <01$\bar{1}$>.

20. The method of claim 12 in which the eutectic metal is antimony and the single crystal formed is N-type.

21. The method of claim 12 in which the eutectic metal is selected from the group consisting of aluminum, indium and gallium and the single crystal layer formed is of the P-type.

22. The method of claim 12 in which the eutectic metal is tin.

23. The method of forming single crystal layers on insulating substrates at high production rates which comprises
- forming an insulating layer on a single crystal silicon wafer,
- forming a number of slit windows through said insulating layer to expose said single crystal silicon wafer,
- depositing a polycrystalline silicon layer on said insulating layer and through the windows thereof,
- disposing a eutectic forming metal on said polycrystalline layer over said window,
- heating the resulting structure to melt the polycrystalline silicon occupying said windows into a eutectic composition, and
- continuing to heat said structure to convert the polycrystalline silicon layer to a single crystal silicon layer.

* * * * *